United States Patent [19]

Shinkawa

[11] Patent Number: 5,831,265
[45] Date of Patent: Nov. 3, 1998

[54] SCANNING ELECTRON MICROSCOPE

[75] Inventor: Takao Shinkawa, Tokyo, Japan

[73] Assignee: JEOL Ltd., Tokyo, Japan

[21] Appl. No.: 890,149

[22] Filed: Jul. 9, 1997

[30] Foreign Application Priority Data

Jul. 10, 1996 [JP] Japan ................................ 8-180738

[51] Int. Cl.⁶ ...................................... H01J 37/244
[52] U.S. Cl. ............................................ 250/310
[58] Field of Search ............................ 250/310, 311, 250/396 R

[56] References Cited

U.S. PATENT DOCUMENTS 5,627,373  5/1997  Keese ........................ 250/310

Primary Examiner—Kiet T. Nguyen
Attorney, Agent, or Firm—Webb Ziesenheim Bruening Logsdon Orkin & Hanson, P.C.

[57] ABSTRACT

A scanning electron microscope equipped with a simple structure that permits the operator to align the electron beam easily even if the accelerating voltage, the working distance, or the condenser lens current varies. This structure has a control circuit supplied with a signal corresponding to the accelerating voltage from an accelerating voltage source and a signal corresponding to the working distance. In response to these two signals, the control circuit reads a given alignment signal from a data storage device and sends it to an adder circuit. The output signal from the adder circuit is supplied to alignment coils via a switch, thus aligning the electron beam along the optical axis.

6 Claims, 3 Drawing Sheets

SCANNING ELECTRON MICROSCOPE

FIELD OF THE INVENTION

The present invention relates to a scanning electron microscope permitting one to easily adjust the alignment of the electron beam that is emitted from an electron gun and accelerated.

DESCRIPTION OF THE PRIOR ART

In the prior art scanning electron microscope, the primary electron beam from the electron gun is sharply focused on a specimen by the action of both a condenser lens system and an objective lens. The primary electron beam is scanned on the specimen in two dimensions by means of scanning coils. The incidence of the electron beam on the specimen produces secondary electrons and other electrons. The produced electrons are detected. The resulting signal is supplied to a CRT synchronized with the scanning of the electron beam. In this way, a secondary electron image or other kind of image is displayed on the CRT.

In this scanning electron microscope, the electron beam produced by the electron gun is focused by the condenser lens system and the objective lens. Also, the beam is scanned in two dimensions by the scanning coils. Furthermore, the beam is deflected by plural deflecting means to achieve the alignment.

With the above-described scanning electron microscope, if the accelerating voltage for the electron beam from the electron gun is varied, if the working distance, i.e., the distance between the objective lens and the specimen, is changed, or if the condenser lens current is varied, the electron beam must be realigned along the optical axis, thus involving cumbersome operations. Especially, in a scanning electron microscope using a semi-in-lens objective lens recently developed, there are provided numerous electron beam deflection means to adjust the optical axis of the electron beam. Whenever instrumental parameters such as the accelerating voltage, working distance, and condenser lens current are changed, the beam deflection means must be readjusted. Consequently, there is a great need for simplification of operations.

SUMMARY OF THE INVENTION

In view of the foregoing, the present invention has been made. It is an object of the present invention to provide a scanning electron microscope having a simple structure permitting a user to easily align the electron beam even if the accelerating voltage, the working distance, or the condenser lens current is varied.

One aspect of the invention resides in a scanning electron microscope having an electron gun for producing and accelerating an electron beam, condenser lenses and an objective lens for focusing the electron beam onto a specimen, a scanning means for scanning the electron beam in two dimensions on the specimen, a detector for detecting a signal produced in response to the impingement of the beam on the specimen, and a display device for displaying a scanned image of the specimen in response to an output signal from the detector. This microscope is characterized in that it comprises a beam-deflecting means for deflecting the electron beam produced and accelerated by the electron gun, a memory in which data about two parameters is stored, a fine adjustment entry means, a control means for controlling the whole microscope, and an adder circuit for producing a sum signal. One of the two parameters is the accelerating voltage of the electron gun. The other is the distance between the objective lens and the specimen. Data is read from the memory according to the present values of these two parameters. The sum signal from the adder circuit is the sum of a signal representing the above-described data read from the memory and the output signal from the fine adjustment entry means. A deflecting signal is supplied to the beam-deflecting means according to the output signal from the adder circuit.

In this instrument, data is read from the memory according to the two parameters, i.e., the accelerating voltage of the electron gun and the distance between the objective lens and the specimen. The signal representing the data read out in this way is supplied to the adder circuit. The output signal from the fine adjustment entry means is also fed to the adder circuit. The sum signal from the adder circuit is supplied as a deflecting signal to the beam-deflecting means.

Another aspect of the invention resides in setting signals supplied to the above-described control means according to certain values of the two parameters, i.e., the accelerating voltage and the distance between the objective lens and the specimen. Interpolation is performed, using the set signals. Thus, all data stored in the memory are created.

A further aspect of the invention resides in reading data from the memory described above and displaying the data. There is further provided a means for correcting and editing the data read from the memory.

A still other aspect of the invention resides in a scanning electron microscope having an electron gun for producing and accelerating an electron beam, condenser lenses and an objective lens for focusing the electron beam onto a specimen, a scanning means for scanning the electron beam in two dimensions on the specimen, a detector for detecting a signal produced in response to the impingement of the beam on the specimen, and a display device for displaying a scanned image of the specimen in response to an output signal from the detector. This microscope is characterized in that it comprises a beam-deflecting means for deflecting the electron beam produced and accelerated by the electron gun, a memory in which data about three parameters is stored, a fine adjustment entry means, a control means for controlling the whole microscope, and an adder circuit for producing a sum signal. These three parameters are the accelerating voltage of the electron gun, the distance between the objective lens and the specimen, and the condenser lens current. Data is read from the memory according to the present values of these three parameters. The sum signal from the adder circuit is the sum of a signal representing the above-described data read from the memory and the output signal from the fine adjustment entry means. A deflecting signal is supplied to the beam-deflecting means according to the output signal from the adder circuit.

An additional aspect of the invention resides in setting signals supplied to the above-described control means according to certain values of the three parameters, i.e., the accelerating voltage, the distance between the objective lens and the specimen, and the condenser lens current. Interpolation is performed, using the set signals. Thus, all data stored in the memory are created.

A yet further aspect of the invention resides in reading data from the memory described above and displaying the data. There is further provided a means for correcting and editing the data read from the memory.

Other objects and features of the invention will appear in the course of the description thereof, which follows.

DETAILED DESCRIPTION OF THE PREFERRED EMBODIMENTS

Figure 1:
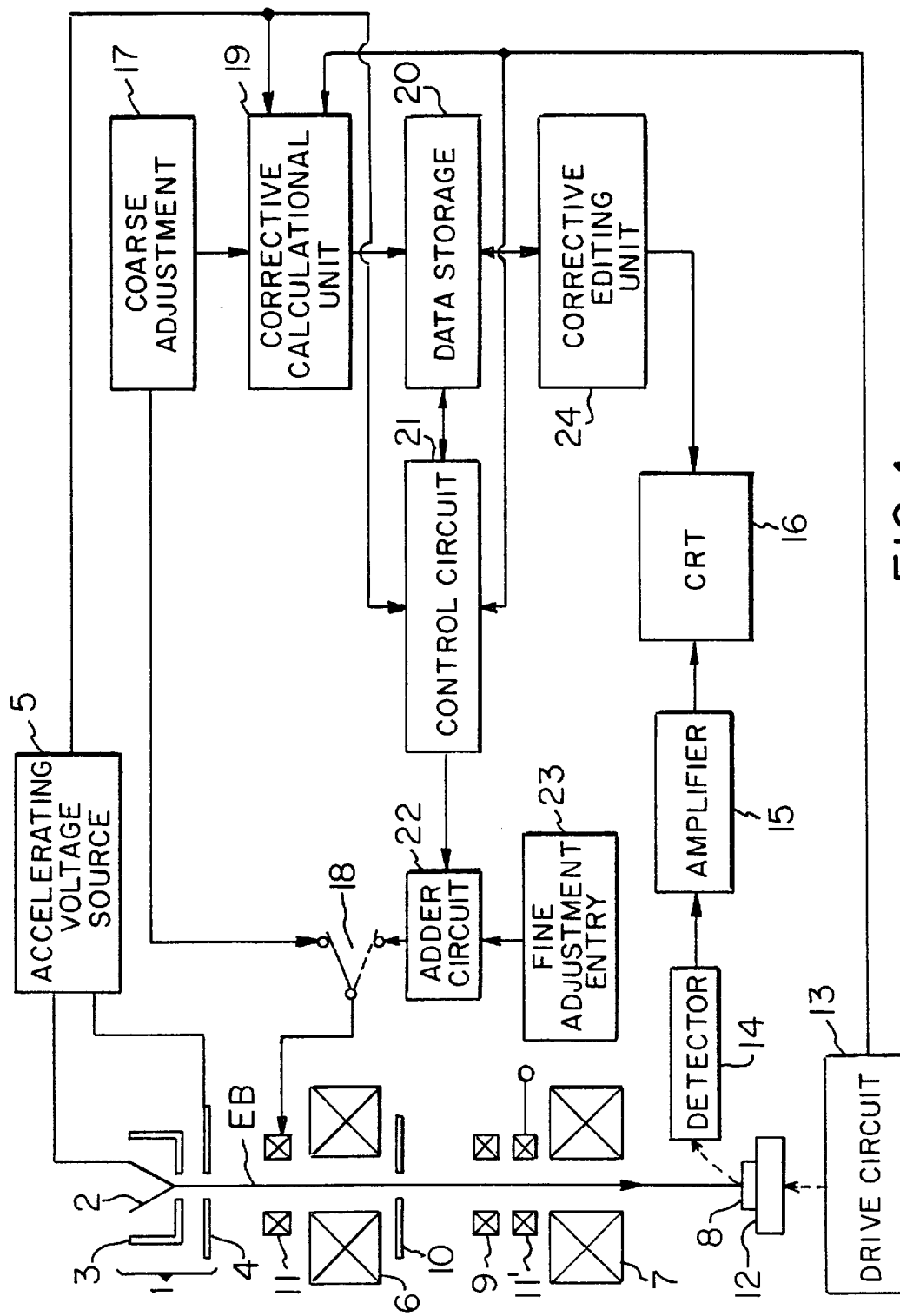
FIG. 1 is a block diagram of a scanning electron microscope in accordance with the present invention.

Referring to FIG. 1, there is shown a scanning electron microscope embodying the concept of the present invention. This microscope has a field emission gun 1 composed of an emitter 2, an extraction electrode 3, and an accelerating electrode 4. An accelerating voltage source 5 applies an accelerating voltage between the emitter 2 and the accelerating electrode 4 that is at ground potential. An extraction voltage source (not shown) applies an extraction voltage between the emitter 2 and the extraction electrode 3.

The field emission gun 1 produces and accelerates an electron beam EB, which is then converged by a condenser lens system 6 and by an objective lens 7 and directed at a specimen 8. The beam EB is scanned in two dimensions on the specimen 8 according to a scanning signal supplied to scanning coils 9. Alignment coils 11 and 11' are arranged along the optical axis of the electron beam. The coil 11 corrects misalignment of the beam with respect to the optical axis of the condenser lens system 6. The coil 11' corrects misalignment of the beam with respect to the optical axis of the objective lens 7.

The specimen 8 is placed on a specimen stage 12, which can be moved along the optical axis by a drive circuit 13. Impingement of the electron beam EB on the specimen 8 produces secondary electrons detected by a secondary electron detector 14. The output signal from the detector 14 is supplied via an amplifier 15 to a CRT 16 synchronized with two-dimensional scanning of the electron beam EB.

The alignment coil 11 is coarsely adjusted by a coarse adjustment device 17. This coarse adjustment device 17 supplies an alignment signal to the alignment coil 11 via a switch 18 to align the electron beam. The coarse adjustment device 17 also furnishes an adjustment signal to a corrective calculational unit 19.

The drive circuit 13 supplies a signal representing the working distance, or the distance between the objective lens 7 and the specimen, to the corrective calculational unit 19. This calculational unit 19 also receives the adjustment signal from the coarse adjustment device 17 and an output signal from the accelerating voltage source 5 that represents the accelerating voltage. The calculational unit 19 creates data about all the attainable values of the accelerating voltage and of the working distance, from the input signals to the calculation unit 19. The created data is sent to a data storage device 20, where the data is stored.

A control circuit 21 consists of a microprocessor, for example. This control circuit 21 receives the output signal from the accelerating voltage source 5 and the output signal from the drive circuit 13, reads corresponding data items from the data storage device 20, and sends these data items to an adder circuit 22. The output signal from the driver circuit 13 represents the distance between the objective lens 7 and the specimen. This adder circuit 22 produces the sum of a fine adjustment signal from a fine adjustment entry device 23 and an output signal from the data storage device 20. The sum signal from the adder circuit 22 is sent to the alignment coil 11 via the switch 18.

A corrective editing unit 24 reads data from the data storage device 20 and graphically displays the data on the CRT 16. Also, after the operator has corrected the data while observing the data on the CRT 16, the corrective editing unit 24 sends the corrected data to the data storage device 20. The operation of the instrument constructed as described thus far is next described.

When a secondary electron image should be obtained, the electron beam EB from the electron gun 1 is sharply focused onto the specimen 8 by the condenser lens system 6 and by the objective lens 7. The beam is scanned in two dimensions on the specimen 8 by the scanning coils 9. The resultant secondary electrons are detected by the secondary electron detector 14. The output signal from the detector 14 is amplified by the amplifier 15 and then supplied to the CRT 16. As a result, a secondary electron image of the specimen is displayed on the CRT 16.

Objective apertures 10 are provided to adjust the divergence angle of the electron beam EB impinging on the specimen 8. These apertures 10 have diameters corresponding various divergence angles. Any arbitrary aperture having a desired diameter can be selected.

It is necessary that alignment of the electron beam along the optical axis by the alignment coil 11 be performed under optimum conditions, depending on the accelerating voltage and on the working distance. Data about alignment signals corresponding to various values of the accelerating voltage and various values of the working distance is stored in the data storage device 20. A signal corresponding to the accelerating voltage is supplied from the accelerating voltage source 5 to the control circuit 21. A signal corresponding to the working distance is fed from the drive circuit 13. In response to these signals, the control circuit 21 reads a corresponding alignment signal from the data storage device 20 and sends the signal to the adder circuit 22.

The alignment signal from the adder circuit 22 is furnished to the alignment coil 11 via the switch 18, thus aligning the electron beam EB along the optical axis. Under this condition, a secondary electron image of the specimen is displayed on the CRT 16. The operator observes this image and operates the fine adjustment entry device 23. The output signal from this fine adjustment entry device 23 is supplied to the adder circuit 22, which produces the sum of this output signal from the fine adjustment entry device 23 and the alignment signal from the data storage device 20.

The operator operates the fine adjustment entry device while observing the image on the CRT 16. He finely adjusts the alignment signal supplied to the alignment coil 11 so that an optimum signal is obtained. As a result, he can easily perform optimum alignment of the electron beam along the optical axis of the condenser lens system 6 according to both accelerating voltage and working distance.

The data stored in the data storage device 20 is created at the time of the manufacture of the instrument. Before the data is created, it is necessary to make a series of mechanical adjustments of the microscope column of the scanning electron microscope. Upon completion of the mechanical adjustments, the switch 18 is so operated that the output signal from the coarse adjustment device 17 is supplied to the alignment coil 11. Then, the coarse adjustment device 17 is operated to create an alignment signal under standard accelerating voltage and standard working distance.

For example, the accelerating voltage source 5 is operated so that the accelerating voltage changes from $V_1$ to $V_2$ and then to $V_3$. Also, the drive circuit 13 for the specimen stage 12 is so operated that the working distance varies from $WD_1$ to $WD_2$. The coarse adjustment device 17 is operated for each combination of the various values of the accelerating voltage and working distance. The image on the CRT 16 is made optimum while observing it. The value of the alignment signal (hereinafter referred to as alignment value) obtained under this optimum condition is sent to the corrective calculational unit 19 from the coarse adjustment device 17.

The values of the accelerating voltage are so set that $V_1$=15 kV, $V_2$=5 kV, and $V_3$=1 kV. The working distance $WD_1$ is 6 mm. The working distance $WD_2$=2 mm. The alignment value is set for the following four combinations:

(1) accelerating voltage=15 kV, working distance=6 mm (2) accelerating voltage=5 kV, working distance=6 mm (3) accelerating voltage=1 kV, working distance=6 mm (4) accelerating voltage=1 kV, working distance=2 mm The corrective calculational unit 19 temporarily stores the alignment value sent from the coarse adjustment device 17 in association with a signal representing the accelerating voltage from the accelerating voltage source 5 and with a signal representing the working distance from the drive circuit 13. The calculational unit 19 finds, by an interpolation method, alignment values at other values of the accelerating voltage and working distance from the alignment values corresponding to the stored four sets of standard accelerating voltages and working distances. Preferably, this calculation is performed, using logarithmic functions. Other approximate curves or approximate curved surfaces may also be employed.

Figure 2:
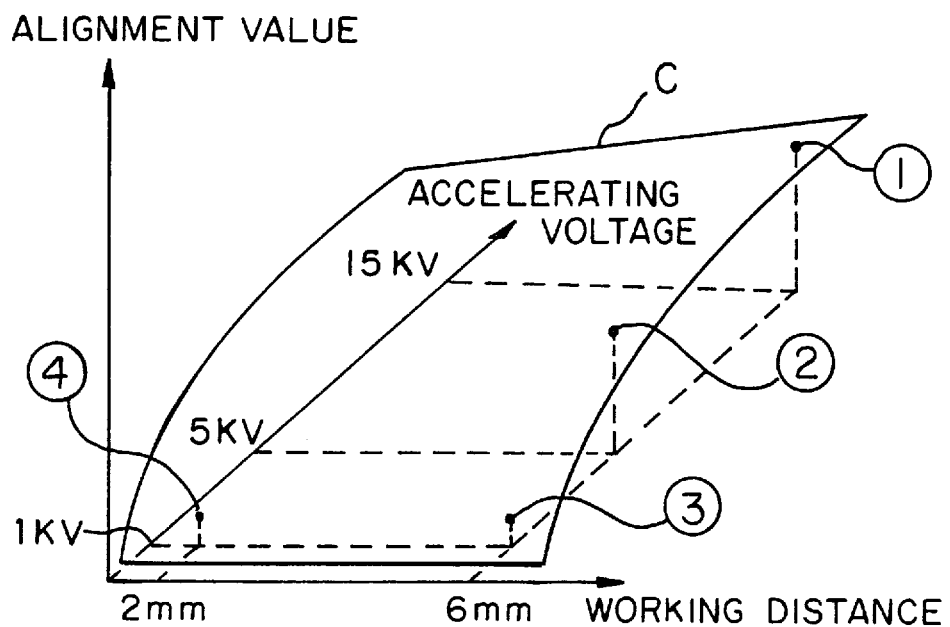
FIG. 2 is a diagram illustrating the relations among the accelerating voltage, the working distance, and the alignment value used by the scanning electron microscope shown in FIG. 1.

As a result, alignment values at every combination of the accelerating voltage and working distance are computed. The results are sent to the data storage device 20, where they are stored. FIG. 2 illustrates the relation of the alignment value to each combination of the accelerating voltage and the working distance. The alignment value is represented in terms of a curved plane C.

The alignment values stored in the data storage device 20 are corrected and edited in the manner described now. The alignment values are read from the data storage device 20 and supplied to the corrective editing unit 24, which sends the alignment value read out to the CRT 16 to display a curve of alignment values corresponding to various values of the accelerating voltage or working distance.

Figure 3:
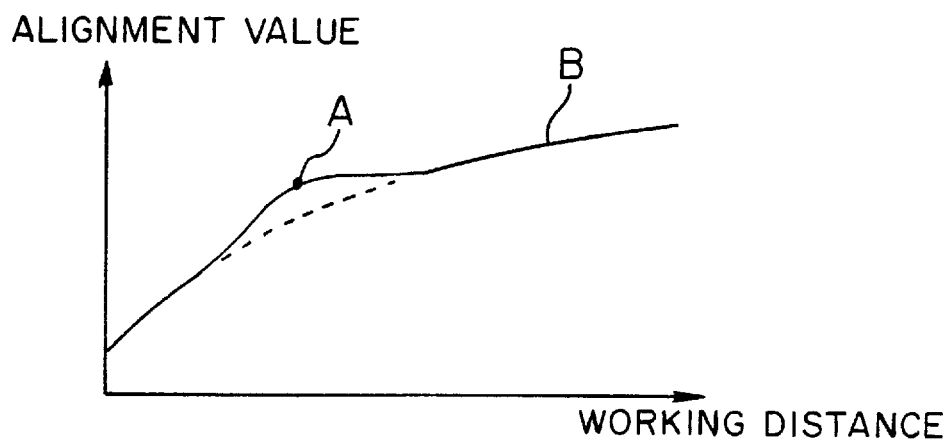
FIG. 3 is a diagram of curves representing alignment values used by the microscope shown in FIG. 1.

FIG. 3 shows a curve B indicating changes in the alignment value at various values of the accelerating voltage at a given value of the working distance. A portion A is located outside the smooth curved line and thus needs a correction. Corrective numerical values are entered from the corrective editing unit to bring the portion A onto the smooth curved line. As a result, a curved line that is smooth as a whole is obtained. The alignment values stored in the data storage device 20 are corrected according to the corrected values.

These corrective or editing operations are performed for each attainable value of the accelerating voltage, thus correcting the alignment values stored in the data storage device 20. These operations for creating data in this way are carried out upon manufacture of each scanning electron microscope. When the instrument is in use, only the fine adjustment entry device is manually operated to create an observable final image.

In the embodiment described above, the operation of the alignment coil 11 is controlled. The operation of the alignment coil 11' on the side of the objective lens 7 may be controlled in exactly the same way. In particular, an adder circuit, a fine adjustment entry device, a switch, a control circuit, a data storage device, a coarse adjustment device, and a corrective calculational unit are provided for use with the alignment coil 11'. These components control the alignment coil 11'. The control circuit, data storage device, and corrective calculational unit may be in common with those shown in FIG. 1.

Figure 4:
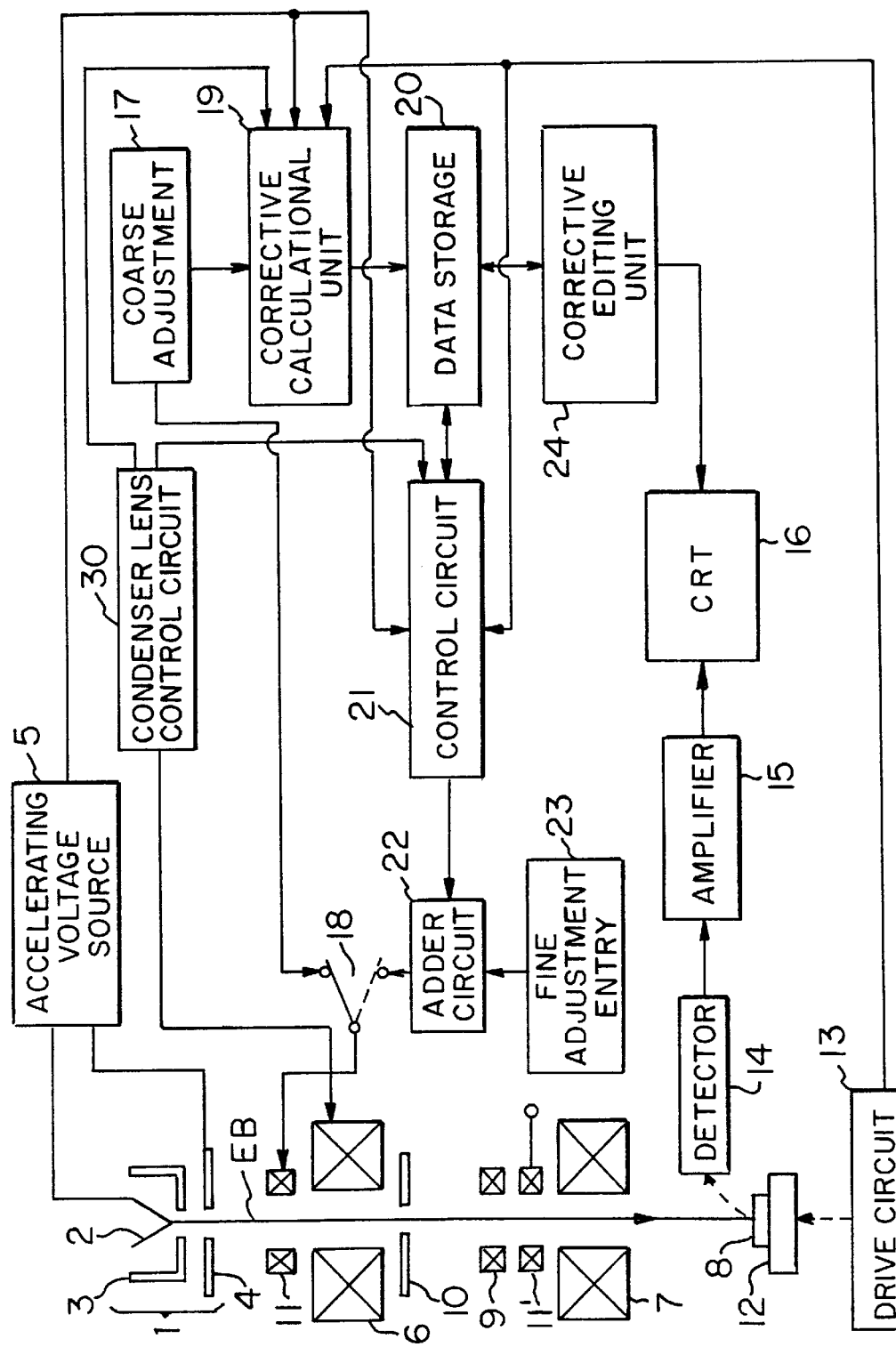
FIG. 4 is a block diagram of another scanning electron microscope in accordance with the invention.

Referring next to FIG. 4, there is shown another scanning electron microscope in accordance with the invention. It is to be noted that like components are indicated by like reference numerals in various figures. In this embodiment, the alignment signal for exciting the alignment coil 11 is found from three parameters, i.e., the accelerating voltage, the working distance, and the condenser lens current. When the condenser lens current fed to the condenser lens system 6 is changed, the beam is generally moved right or left. Therefore, an alignment value that is optimum after this change has been made is found, using the coarse adjustment device 17, for various condenser lens currents.

A condenser lens control circuit 30 for controlling the condenser lens system 6 is connected with the corrective calculational unit 19. In this case, data about alignment signals produced according to various values of the three parameters (i.e., the accelerating voltage, the working distance, the condenser lens current) is stored in the data storage device 20. This data is created at the time of the manufacture of the instrument in the same way as in the embodiment described already in connection with FIG. 1. Suppose that the accelerating voltage assumes $V_1$, $V_2$, and $V_3$, the working distance takes $WD_1$ and $WD_2$, and the condenser lens current takes on $L_1$, $L_2$, and $L_3$. The coarse adjustment device 17 is operated at these various combinations of the three parameters. The image on the CRT 16 is made optimum while observing it. The alignment value giving this optimum condition is sent to the corrective calculational unit 19.

Assume that $V_1$=15 kV, $V_2$=5 kV, $V_3$=1 kV, $WD_1$=6 mm, $WD_2$=2 mm, $L_1$=0.2 A, $L_2$=0.5 A, and $L_3$=1.0 A. The alignment value is set according to 12 combinations of these values. More specifically, the above-described combinations (1) accelerating voltage=15 kV, working distance=6 mm (2) accelerating voltage=5 kV, working distance=6 mm (3) accelerating voltage=1 kV, working distance=6 mm (4) accelerating voltage=1 kV, working distance=2 mm are set for each of the condenser lens currents 0.2 A, 0.5 A, and 1.0 A. Thus, 12 combinations result.

The corrective calculational unit 19 temporarily stores the alignment value sent from the coarse adjustment device 17 in association with the signal indicating the accelerating voltage from the accelerating voltage source 5, the signal indicating the working distance from the drive circuit 13, and the signal from the condenser lens control circuit 30. The corrective calculational unit 19 calculates, by an interpolation method, an alignment value at other accelerating voltage, working distance, and condenser lens current, from alignment values given by the stored accelerating voltage values, working distance values, and condenser lens current values. Alignment values at every combination of the various values of these three parameters are computed and stored in the data storage device 20. When the alignment of the electron beam is subsequently performed, only the fine adjustment entry device 23 is operated to create an observable image. The electron beam EB is aligned along the optical axis, using the alignment coil 11. In particular, the adder circuit 22 produces the sum of the output signal from the fine adjustment entry device 23 and one alignment value stored in the data storage device 20. The output signal from the adder circuit 22 is supplied to the alignment coil 11, thus aligning the electron beam along the optical axis. Similar operations are carried out for the alignment coil 11' on the side of the objective lens.

While the preferred embodiments of the invention have been described in detail thus far, it is to be understood that the invention is not limited thereto. In the above embodiments, the electron beam is aligned along the optical axis of the condenser lens system 6. The invention can be applied to correction of the center position of a condenser lens or objective lens stigmator coil supplied with a current that is required to be varied, depending on two parameters, (i.e., the accelerating voltage and the working distance) or on three parameters (i.e., the accelerating voltage, the working distance, and the condenser lens current). Furthermore, the invention is also applicable to correction of alignment of the electron beam along the optical axis of the objective lens. In this way, the invention can be applied to every kind of alignment correction.

In the instrument shown in FIG. 1, data is read from a memory, depending on the accelerating voltage and on the distance between the objective lens and the specimen. A signal representing this data is added to the output signal from a fine adjustment entry device, producing a sum signal. A deflecting signal supplied to a beam-deflecting means is controlled according to the sum signal. Therefore, when the instrument is set into operation, the adjustment is automatically completed almost fully. If the accelerating voltage or the working distance is varied, an almost appropriate deflecting signal is immediately supplied to the beam-deflecting means. The operator can easily align the electron beam by fine control, using the fine adjustment entry device.

In the instrument shown in FIG. 4, data is read from a memory, depending on three parameters (i.e., the accelerating voltage, the distance between the objective lens and the specimen, and the condenser lens current). A signal representing this data is added to the output signal from a fine adjustment entry device, producing a sum signal. A deflecting signal supplied to a beam-deflecting means is controlled according to the sum signal. Therefore, when the instrument is set into operation, the adjustment is automatically completed almost fully. If the accelerating voltage, the working distance, or the condenser lens current is varied, a nearly appropriate deflecting signal is immediately supplied to the beam-deflecting means. The operator can easily align the electron beam by fine control using the fine adjustment entry device.

Especially, where numerous stages of deflection are present as in a semi-in-lens scanning electron microscope, the amount of operation for aligning the electron beam can be reduced greatly. Also, the differences among the individual final products of the scanning electron microscope can be accommodated. Moreover, the uniformity of the quality of the shipped final products can be improved.

If the deflecting signal supplied to the deflecting means is set according to the three parameters (i.e., the accelerating voltage, the distance between the objective lens and the specimen, and the condenser lens current), and if all data to be stored in the memory are created by an interpolation method from the set deflecting signal, an exorbitant amount of data for the deflecting means can be created in a short time.

If data stored in the memory can be read, displayed, corrected and edited, errors introduced in the data due to interpolation can be easily corrected.

Having thus described my invention with the detail and particularity required by the Patent Laws, what is desired protected by Letters Patent is set forth in the following claims.

What is claimed is:

1. A scanning electron microscope having an electron gun for producing and accelerating an electron beam, condenser lenses and an objective lens for focusing the electron beam onto a specimen, a scanning means for scanning the electron beam in two dimensions on the specimen, a detector for detecting a signal produced in response to impingement of the beam on the specimen, and a display device for displaying a scanned image of the specimen in response to an output signal from the detector, said scanning electron microscope comprising:

a beam-deflecting alignment means for deflecting the electron beam produced and accelerated by the electron gun;

a memory in which alignment data about two parameters, including accelerating voltage and the distance between the objective lens and the specimen, is stored;

a fine adjustment entry means;

a control means for controlling the whole microscope; and an adder circuit for producing a sum signal that is the sum of a signal representing alignment data read from the memory according to the two parameters and an output signal from the fine adjustment entry means, a deflecting signal supplied to said beam-deflecting alignment means responding to said sum signal.

2. The scanning electron microscope of claim 1, wherein signals supplied to said control means are set according to certain values of said two parameters, including the accelerating voltage and the distance between the objective lens and the specimen, and wherein interpolation is performed, using the set signals, to create all data stored in the memory.

3. The scanning electron microscope of claim 2, further comprising means for reading data from said memory, displaying said data, correcting said data, and editing said data.

4. A scanning electron microscope having an electron gun for producing and accelerating an electron beam, condenser lenses and an objective lens for focusing the electron beam onto a specimen, a scanning means for scanning the electron beam in two dimensions on the specimen, a detector for detecting a signal produced in response to impingement of the beam on the specimen, and a display device for displaying a scanned image of the specimen in response to an output signal from the detector, said scanning electron microscope comprising:

a beam-deflecting alignment means for deflecting the electron beam produced and accelerated by said electron gun;

a memory in which alignment data about three parameters, including accelerating voltage, the distance between the objective lens and the specimen, and condenser lens current, is stored;

a fine adjustment entry means;

a control means for controlling the whole microscope; and an adder circuit for producing a sum signal that is the sum of a signal representing alignment data read from the memory according to the three parameters and an output signal from the fine adjustment entry means, a deflecting signal supplied to said beam-deflecting alignment means responding to said sum signal.

5. The scanning electron microscope of claim 4, wherein signals supplied to said control means are set according to certain values of the three parameters, including the accelerating voltage, the distance between the objective lens and the specimen and the condenser lens current, and wherein interpolation is performed.

6. The scanning electron microscope of claim 5, further comprising means for reading data from said memory, displaying said data, correcting said data, and editing said data.

* * * * *